US011495389B2

(12) United States Patent
Wang et al.

(10) Patent No.: US 11,495,389 B2
(45) Date of Patent: Nov. 8, 2022

(54) INDUCTOR WITH EMBEDDED SYMMETRIC RESONANT CIRCUIT

(71) Applicant: Apple Inc., Cupertino, CA (US)

(72) Inventors: Hongrui Wang, San Jose, CA (US); Saihua Lin, Santa Clara, CA (US); Abbas Komijani, Mountain View, CA (US); Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 50 days.

(21) Appl. No.: 15/930,084

(22) Filed: May 12, 2020

(65) Prior Publication Data

US 2021/0358677 A1 Nov. 18, 2021

(51) Int. Cl.
| | |
|---|---|
| *H01F 27/28* | (2006.01) |
| *H03H 7/01* | (2006.01) |
| *H03H 7/09* | (2006.01) |
| *H01F 17/00* | (2006.01) |
| *H01F 5/00* | (2006.01) |
| *H01F 38/14* | (2006.01) |
| *H03H 7/42* | (2006.01) |
| *H03H 1/00* | (2006.01) |

(52) U.S. Cl.
CPC ......... *H01F 27/2804* (2013.01); *H01F 5/003* (2013.01); *H01F 17/0013* (2013.01); *H01F 38/14* (2013.01); *H03H 7/0115* (2013.01); *H03H 7/09* (2013.01); *H03H 7/427* (2013.01); *H01F 2017/0026* (2013.01); *H01F 2027/2814* (2013.01); *H03H 2001/0085* (2013.01)

(58) Field of Classification Search
CPC ......... H01F 17/0013; H01F 2017/0026; H01F 5/003; H01F 38/14; H01F 27/2804; H03H 7/09; H03H 7/0115; H03H 7/427

USPC ......................................... 333/177, 181, 185
See application file for complete search history.

(56) References Cited

U.S. PATENT DOCUMENTS

| | | |
|---|---|---|
| 7,176,776 B1 | 2/2007 | Tantwai et al. |
| 9,337,138 B1 * | 5/2016 | Abugharbieh ...... H01L 23/5223 |
| 9,998,168 B2 | 6/2018 | Khlat |
| 2013/0154768 A1 | 6/2013 | Taniguchi |

(Continued)

FOREIGN PATENT DOCUMENTS

JP 2005005685 A 5/2005

OTHER PUBLICATIONS

Indian Office Action for Indian Patent Application No. 202114020894 dated Mar. 1, 2022; 7 pgs.

*Primary Examiner* — Rakesh B Patel
(74) *Attorney, Agent, or Firm* — Fletcher Yoder PC

(57) ABSTRACT

Radio frequency filtering circuitry blocks certain frequencies in an outgoing signal so that the signal may be transmitted over a desired frequency. The radio frequency filtering circuitry includes a first inductor having a first coil and a second inductor coupled to and disposed within the first coil. The second inductor has a second coil and a third coil symmetrical to the second coil. When current is applied to the radio frequency filtering circuitry, the current in the second coil causes a first induced current in the first coil and the current in the third coil causes a second induced current in the first coil, wherein the second induced current is approximately equal in magnitude and opposite in direction to the first induced current. As such, the second induced current may compensate for the first induced current.

20 Claims, 10 Drawing Sheets

(56) References Cited

U.S. PATENT DOCUMENTS

| | | | |
|---|---|---|---|
| 2015/0364242 A1* | 12/2015 | Aboush | H03F 1/223 |
| | | | 336/192 |
| 2016/0211071 A1 | 7/2016 | Jeong | |
| 2017/0070199 A1 | 3/2017 | Anderson et al. | |
| 2020/0266792 A1* | 8/2020 | Bagga | H03H 7/0115 |

* cited by examiner

INDUCTOR WITH EMBEDDED SYMMETRIC RESONANT CIRCUIT

BACKGROUND

The present disclosure relates generally to electronic devices, and more particularly, to electronic devices that transmit and receive radio frequency signals for wireless communication.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

An electronic communication device may include radio frequency filtering circuitry (e.g., an LC (inductor-capacitor) choke) that enables pass-through or blocks certain frequencies in an outgoing signal so that the signal may be transmitted over a desired frequency. In particular, the radio frequency filtering circuitry may include a first inductor (e.g., a differential inductor) coupled to a capacitor that provide a target impedance (e.g., zero or infinite impedance) at a resonant frequency of the radio frequency filtering circuitry. The radio frequency filtering circuitry may also include a second inductor (e.g., a second harmonic distortion (HD2) inductor) that filters second harmonics in the outgoing signal to suppress oscillator flicker noise.

If the second inductor and the first inductor are placed too close together, current in the second inductor may cause a transformer effect with the first inductor. The transformer effect induces current in the first inductor, which may potentially cause differential imbalance in the first inductor and negatively affect the filtering performance of the first inductor and the capacitor. To maintain filtering performance by decreasing the transformer effect, the second inductor may be placed a sufficient distance from the first inductor. However, placing the second inductor the sufficient distance from the first inductor may take up valuable space in the electronic device, which could be used for other circuitry or electronic components.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic device includes radio frequency filtering circuitry (e.g., a radio frequency filter or LC (inductor-capacitor) choke) that enables pass-through or blocks certain frequencies in an outgoing signal so that the signal may be transmitted over a desired frequency. The radio frequency filtering circuitry includes a first inductor having a first coil coupled to a capacitor, and a second inductor disposed within the first coil of the first inductor. The second inductor comprises a symmetric layout that compensates for a transformer effect between the second inductor and the first inductor.

In one embodiment, the second inductor includes second and third coils, such that current in the second inductor generates a first transformer effect between the current in the second coil and the first coil, thus inducing current in a first direction in the first coil, while generating a second transformer effect between the current in the third coil and the first coil, thus inducing current in a second direction in the first coil opposite the first direction. Because the second coil and the third coil may be symmetrical (e.g., made of the same material, have the same thickness, have the same length, have the same dimensions, have the same number of coils, facing each other around one or more axes), the first and second transformer effects may have the same magnitude, and thus the current induced by the third coil in the first coil may compensate for or cancel the current induced by the second coil in the first coil.

By disposing the second inductor within the first inductor (e.g., instead of separate from the first inductor and thus using space in the electronic device), valuable space in the electronic device may be conserved.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

The disclosed embodiments may apply to a variety of electronic devices. In particular, any electronic device that transmits signals over a communication network may incorporate the disclosed radio frequency filtering circuitry to ensure that the signals are transmitted over a target frequency, while conserving space in the electronic device. With the foregoing in mind, a general description of suitable electronic devices that may include the disclosed radio frequency filtering circuitry is provided below.

Figure 1:
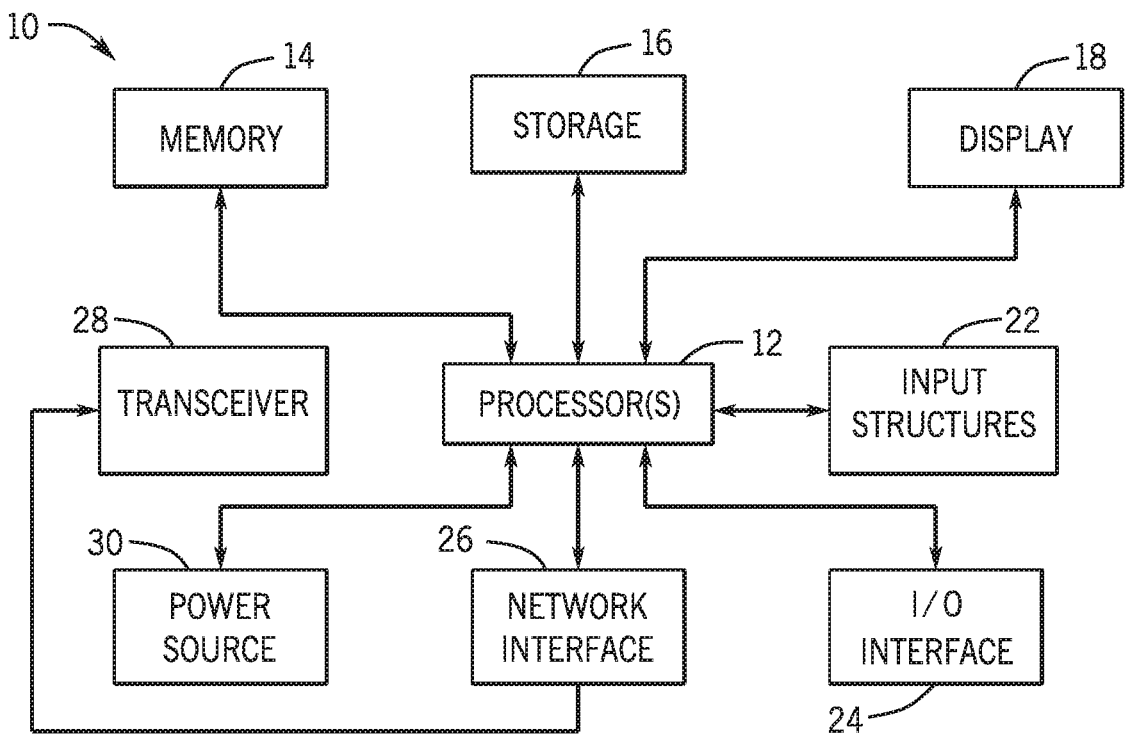
FIG. 1 is a schematic block diagram of an electronic device including a transceiver, in accordance with an embodiment.

Turning first to FIG. 1, an electronic device 10 according to an embodiment of the present disclosure may include, among other things, one or more of processors 12, memory 14, nonvolatile storage 16, a display 18, input structures 22, an input/output (I/O) interface 24, a network interface 26, a transceiver 28, and a power source 30. The various functional blocks shown in FIG. 1 may include hardware elements (including circuitry), software elements (including computer code stored on a computer-readable medium) or a combination of both hardware and software elements. Furthermore, a combination of elements may be included in tangible, non-transitory, and machine-readable medium that include machine-readable instructions. The instructions may be executed by the processor 12 and may cause the processor 12 to perform operations as described herein. It should be noted that FIG. 1 is merely one example of a particular embodiment and is intended to illustrate the types of elements that may be present in the electronic device 10. Additionally, reference to the processor 12 in the present disclosure should be understood to include any processor or combination of processors of the one or more of processors 12.

Figure 2:
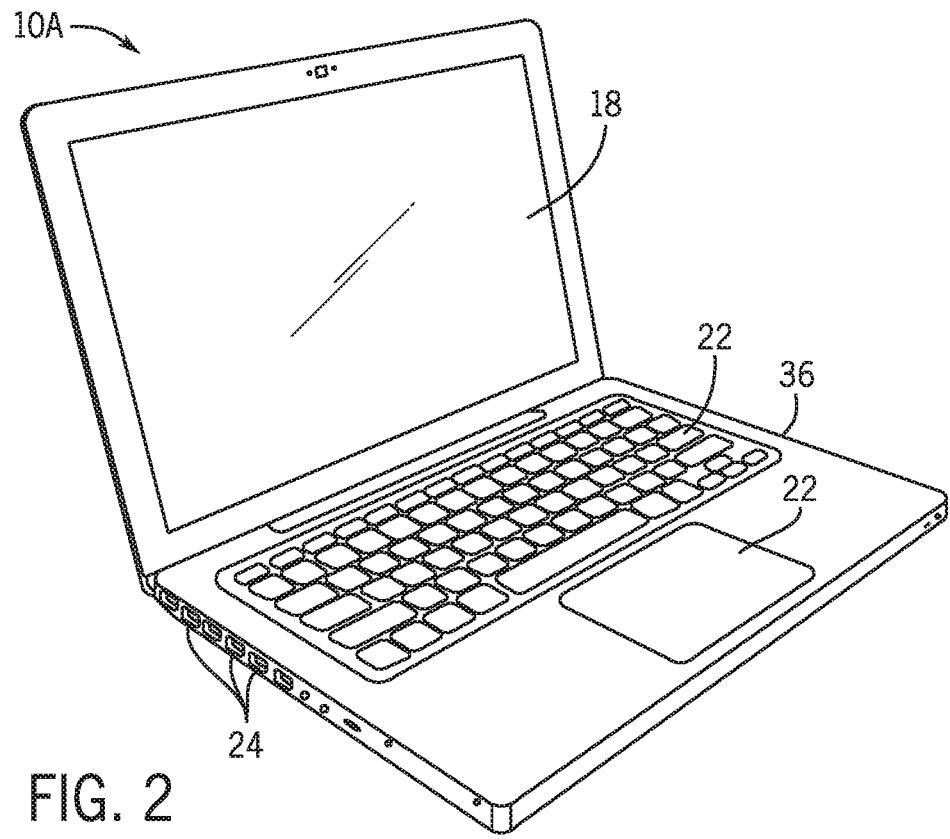
FIG. 2 is a perspective view of a notebook computer representing a first embodiment of the electronic device of FIG. 1.
Figure 4:
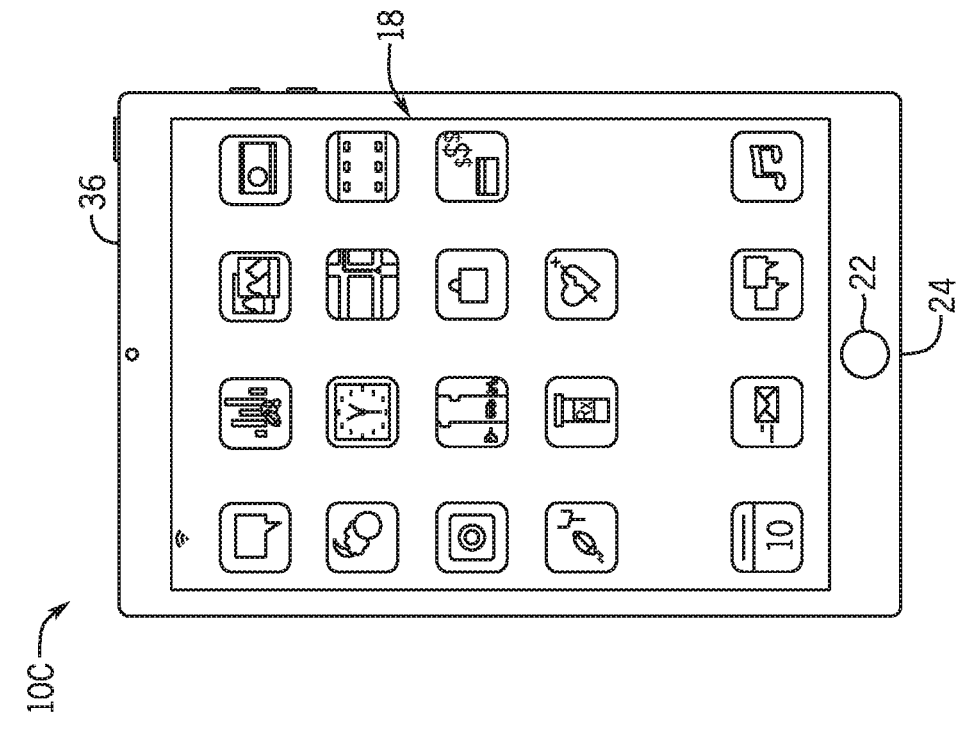
FIG. 4 is a front view of another handheld device representing a third embodiment of the electronic device of FIG. 1.
Figure 3:
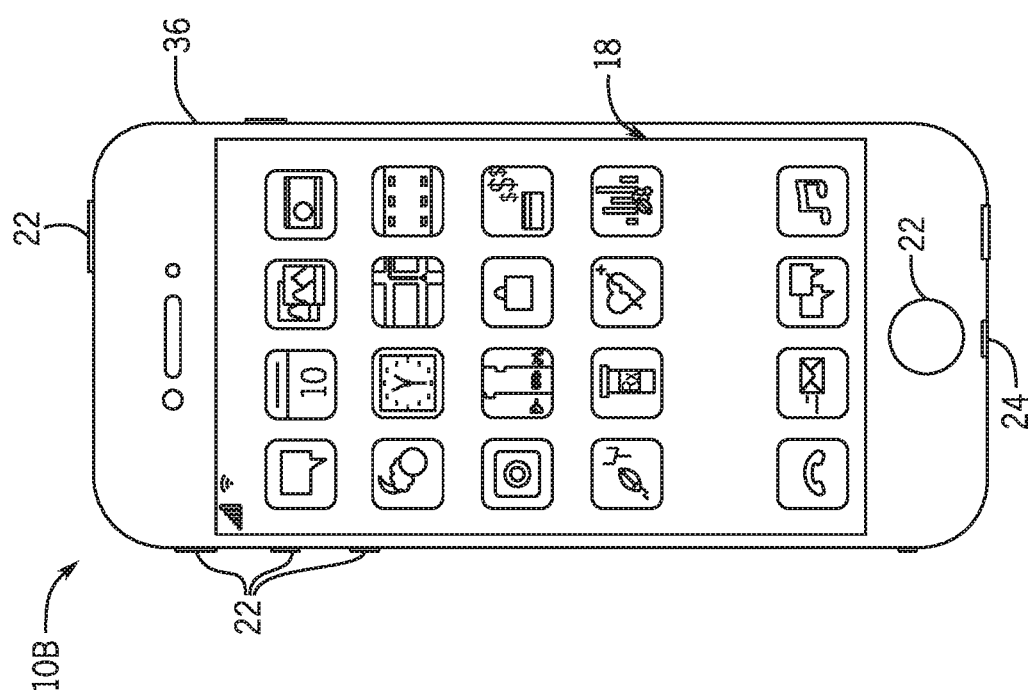
FIG. 3 is a front view of a handheld device representing a second embodiment of the electronic device of FIG. 1.
Figure 5:
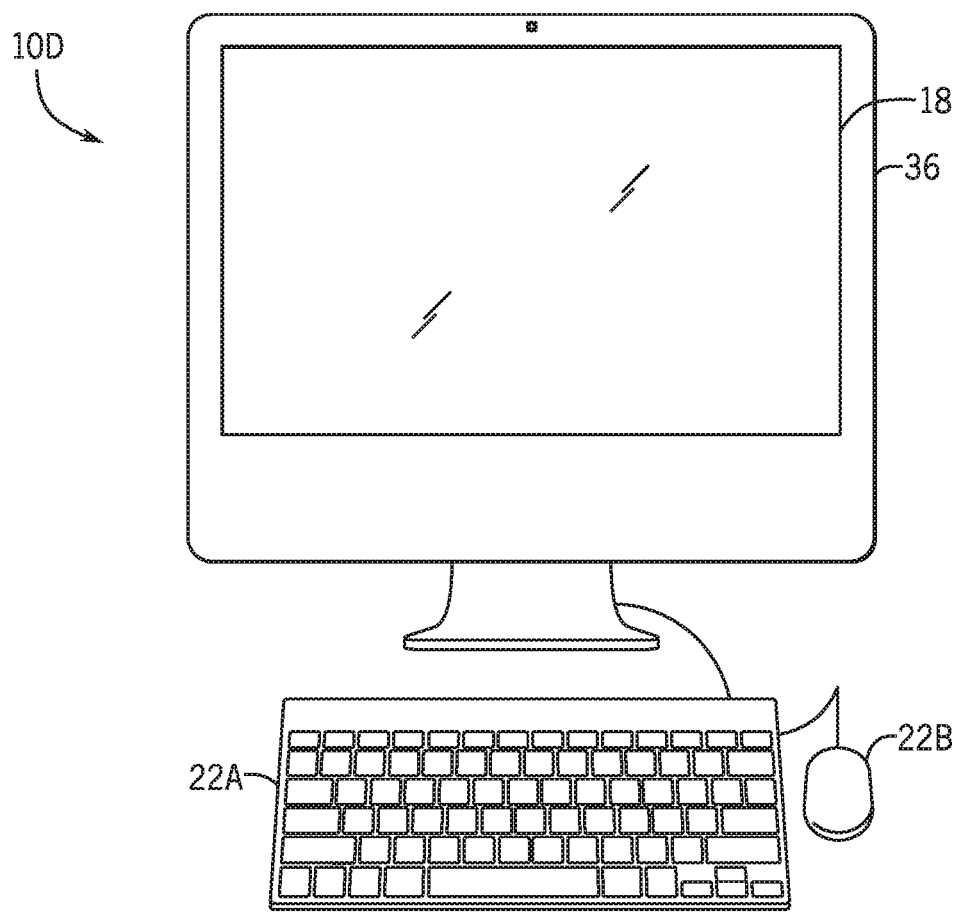
FIG. 5 is a front view of a desktop computer representing a fourth embodiment of the electronic device of FIG. 1.
Figure 6:
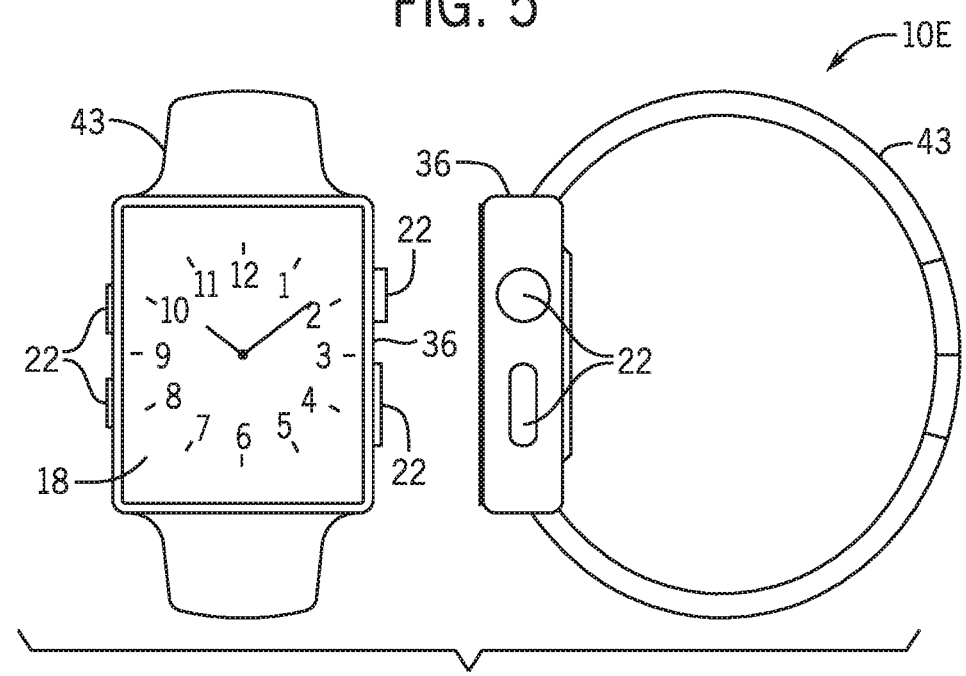
FIG. 6 is a front view and side view of a wearable electronic device representing a fifth embodiment of the electronic device of FIG. 1.

By way of example, a block diagram of the electronic device 10 may represent the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor 12 may operably couple with the memory 14 and the nonvolatile storage 16 to perform various algorithms. Such programs or instructions executed by the processor 12 may be stored in any suitable article of manufacture that includes one or more tangible, computer-readable media at least collectively storing the instructions or processes, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions executable by the processor 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, $4^{th}$ generation (4G) cellular network, long term evolution (LTE®) cellular network, long term evolution license assisted access (LTE-LAA) cellular network, $5^{th}$ generation (5G) cellular network, or New Radio (NR) cellular network. The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FI®, WIMAX®, mobile WIMAX®, 4G, LTE®, 5G, and so forth) using the transceiver 28. The transceiver 28 may include circuitry useful in both wirelessly receiving and wirelessly transmitting signals (e.g., data signals, wireless data signals, wireless carrier signals, RF signals), such as a transmitter and/or a receiver. Indeed, in some embodiments, the transceiver 28 may include a transmitter and a receiver combined into a single unit, or, in other embodiments, the transceiver 28 may include a transmitter separate from a receiver. The transceiver 28 may transmit and receive RF signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 30. The power source 30 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers) and/or those that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The notebook computer 10A may include a housing or the enclosure 36, the display 18, the input structures 22, and ports associated with the I/O interface 24. In one embodiment, the input structures 22 (such as a keyboard and/or touchpad) may enable interaction with the notebook computer 10A, such as starting, controlling, or operating a graphical user interface (GUI) and/or applications running on the notebook computer 10A. For example, a keyboard and/or touchpad may facilitate user interaction with a user interface, GUI, and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include the enclosure 36 to protect interior elements from physical damage and to shield them from electromagnetic interference. The enclosure 36 may surround the display 18. The I/O interface 24 may open through the enclosure 36 and may include, for example, an I/O port for a hard wired connection for charging and/or content manipulation using a standard connector and protocol, such as the Lightning connector provided by Apple Inc. of Cupertino, Calif., a universal serial bus (USB), or other similar connector and protocol.

The input structures 22, in combination with the display 18, may enable user control of the handheld device 10B. For example, the input structures 22 may activate or deactivate the handheld device 10B, navigate a user interface to a home screen, present a user-editable application screen, and/or activate a voice-recognition feature of the handheld device 10B. Other of the input structures 22 may provide volume control, or may toggle between vibrate and ring modes. The input structures 22 may also include a microphone to obtain a user's voice for various voice-related features, and a speaker to enable audio playback. The input structures 22 may also include a headphone input to enable input from external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. of Cupertino, Calif. It should be noted that the computer 10D may also represent a personal computer (PC) by another manufacturer. The enclosure 36 may protect and enclose internal elements of the computer 10D, such as the display 18. In certain embodiments, a user of the computer 10D may interact with the computer 10D using various peripheral input devices, such as keyboard 22A or mouse 22B (e.g., input structures 22), which may operatively couple to the computer 10D.

Similarly, FIG. 6 depicts a wearable electronic device 10E representing another embodiment of the electronic device 10 of FIG. 1. By way of example, the wearable electronic device 10E, which may include a wristband 43, may be an Apple Watch® by Apple Inc. of Cupertino, Calif. However, in other embodiments, the wearable electronic device 10E may include any wearable electronic device such as, a wearable exercise monitoring device (e.g., pedometer, accelerometer, heart rate monitor), or other device by another manufacturer. The display 18 of the wearable electronic device 10E may include a touch screen version of the display 18 (e.g., LCD, OLED display, active-matrix organic light emitting diode (AMOLED) display, and so forth), as well as the input structures 22, which may facilitate user interaction with a user interface of the wearable electronic device 10E.

Figure 7:
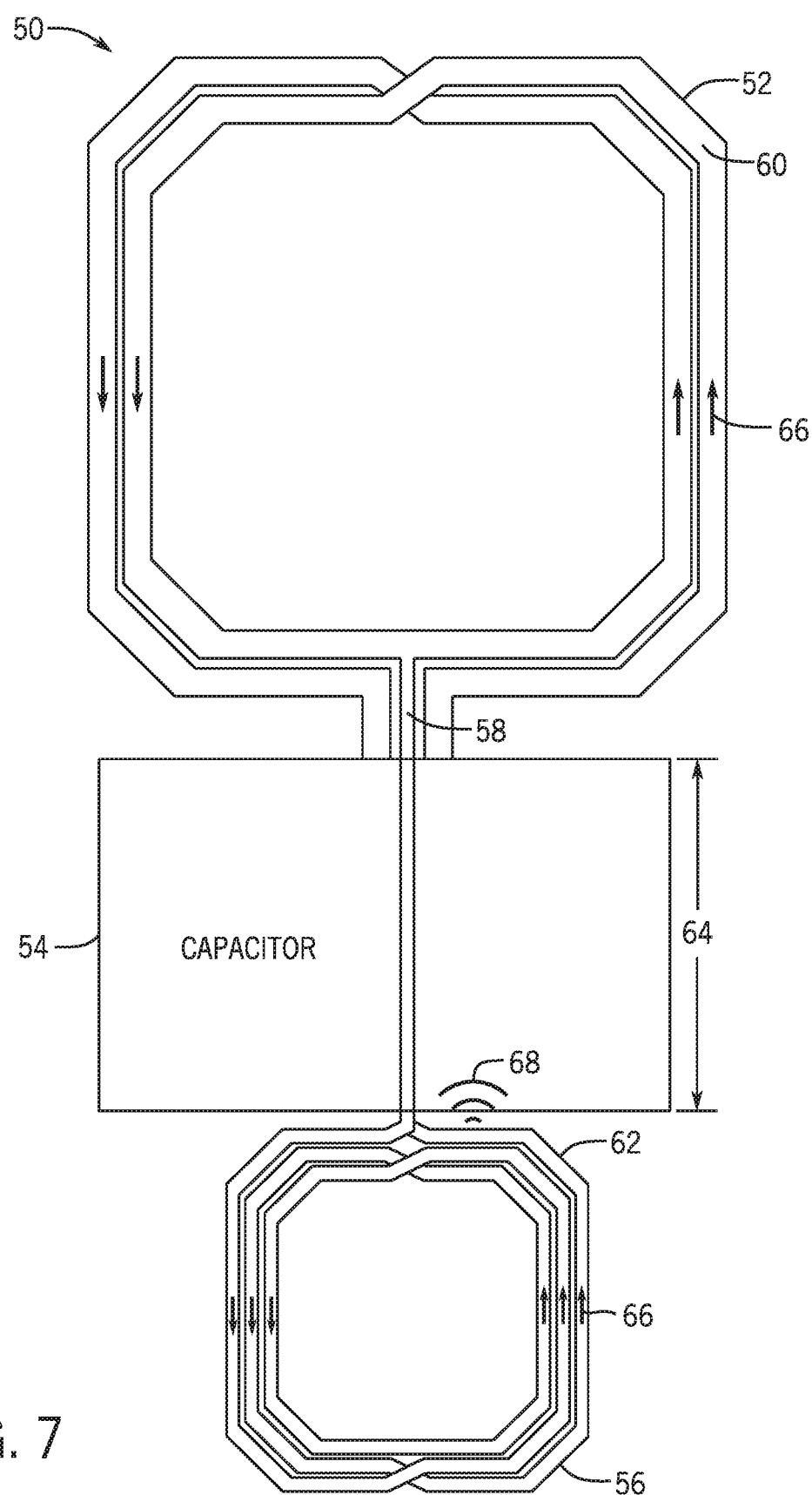
FIG. 7 is a schematic diagram showing radio frequency filtering circuitry having a first inductor and a second inductor spaced apart from the first inductor.

In certain embodiments, as previously noted above, each embodiment (e.g., notebook computer 10A, handheld device 10B, handheld device 10C, computer 10D, and wearable electronic device 10E) of the electronic device 10 may include the one or more transceivers 28. With the foregoing in mind, FIG. 7 is a schematic diagram showing a radio frequency filtering circuitry 50 having a first inductor 52, a capacitor 54, and a second inductor 56. The radio frequency filtering circuitry 50 may act as an LC (inductor-capacitor) choke that enables filtering (e.g., pass-through or blocking) of certain frequencies in an outgoing signal so that the signal may be transmitted over a desired frequency.

In particular, the first inductor 52 is coupled to the capacitor 54. The first inductor 52 may include differential inductor or choke that reduces or eliminates differential mode noise. The first inductor 52 and the capacitor 54 may provide a target impedance (e.g., zero or infinite impedance) at a resonant frequency of the radio frequency filtering circuitry 50. For example, the first inductor 52 and the capacitor 54 may implement a band-pass filter by providing zero impedance at the resonant frequency of the radio frequency filtering circuitry 50 (e.g., when the first inductor 52, the capacitor 54, and a load are coupled in series, or when the first inductor 52, the capacitor 54, and the load are coupled in parallel). That is, the first inductor 52 and the capacitor 54 may enable pass-through of signals at or near the resonant frequency. As another example, the first inductor 52 and the capacitor 54 may implement a band-stop filter by providing infinite impedance at the resonant frequency of the radio frequency filtering circuitry 50 (e.g., when the first inductor 52 and the capacitor 54 are coupled in parallel, and the first inductor 52 and the capacitor 54 are coupled to a load in series). In some embodiments, the first inductor 52 and the capacitor 54 may provide a high impedance choke at a supply node of a power amplifier (e.g., an inverse Class-D power amplifier) of one or more transceivers 28 of the electronic device 10.

If, for example, the first inductor 52 includes a voltage-biased cross-coupled oscillator, a second harmonic resonance of an input signal at a common mode node may facilitate rejecting flicker noise up-conversion. As such, the radio frequency filtering circuitry 50 may include a second inductor 56 (e.g., a second harmonic distortion (HD2) inductor) coupled to the first inductor 52 (e.g., via a center tap 58 of the first inductor 52) that filters second harmonics in the input signal to suppress oscillator flicker noise.

The first inductor 52 may include a first coil 60, and the second inductor 56 may include a second coil 62. As illustrated, the second inductor 56 may be spaced a distance 64 apart from the first inductor 52. The distance 64 may be sufficiently large, such that, when current 66 is applied to the radio frequency filtering circuitry 50, the current 66 in the second coil 62 of the second inductor 56 does not cause a transformer effect with the first coil 60. That is, the current 66 in the second coil 62 of the second inductor 56 may generate a magnetic field 68, but, due to the distance 64 from the first inductor 52, the magnetic field 68 does not have sufficient strength to induce a current (in the first coil 60. As such, the current 66 in the second inductor 56 may not affect filtering performance of the first inductor 52 and the capacitor 54.

However, disposing the second inductor 56 separate from (e.g., external to) the first inductor 52 takes up additional surface area (e.g., on one or more printed circuit boards (PCBs) of the electronic device 10). Moreover, the distance 64 between the first inductor 52 and the second inductor 56 may be filled with other circuitry or electronic components (e.g., other than or in addition to the capacitor 54), which may affect or otherwise render unpredictable a common mode impedance of the first inductor 52 and/or the second inductor 56 when active. Additionally, any inductive coupling between the first inductor 52 and the second inductor 56 may cause differential imbalance in the first inductor 52 and/or the second inductor 56, and reduce or render unpredictable the filtering performance of the first inductor 52 and the capacitor 54.

Figure 8:
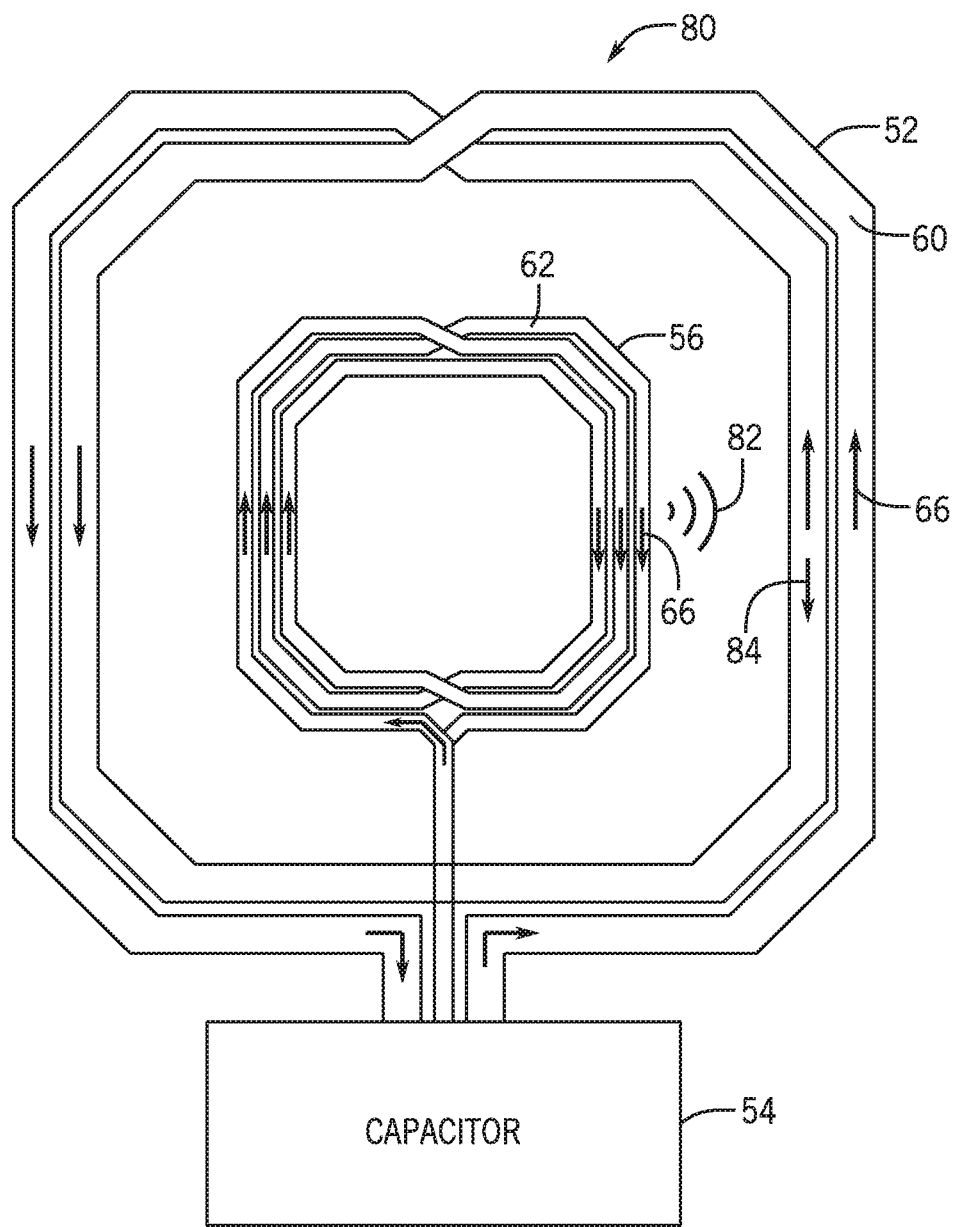
FIG. 8 is a schematic diagram showing radio frequency filtering circuitry having a first inductor and a second inductor disposed within the first inductor.

At least some of these issues that arise with the radio frequency filtering circuitry 50 of FIG. 7 may be avoided or mitigated with the radio frequency filtering circuitry 80 illustrated in FIG. 8. FIG. 8 is a schematic diagram showing radio frequency filtering circuitry 80 having the first inductor 52 and the second inductor 56 disposed within the first inductor 52. The radio frequency filtering circuitry 80 of FIG. 8 provides a compact design that conserves space in comparison to the radio frequency filtering circuitry 50 of FIG. 7 by eliminating the space taken up by disposing the second inductor 56 separate from the first inductor 52. Moreover, because the inductors 52, 56 are not coupled over the capacitor 54 and/or other circuitry, the common mode impedance of the first inductor 52 and/or the second inductor 56 may be well-defined (e.g., not affected by the capacitor 54 and/or other circuitry being active).

However, due to the proximity of the second inductor 56 to the first inductor 52, when current 66 is applied to the radio frequency filtering circuitry 50, the current 66 in the second coil 62 of the second inductor 56 causes a transformer effect 82 with the first coil 60. That is, the current 66 in the second coil 62 of the second inductor 56 generates a magnetic field that induces a current (e.g., 84) in the first coil 60, which may cause differential imbalance in the first inductor 52 and affect the inductance of the first inductor 52 (e.g., by subtracting from the current 66 in the first coil 60). That is, the induced current 84 in the first inductor 52 may negatively affect the filtering performance of the first inductor 52 and the capacitor 54.

Figure 9:
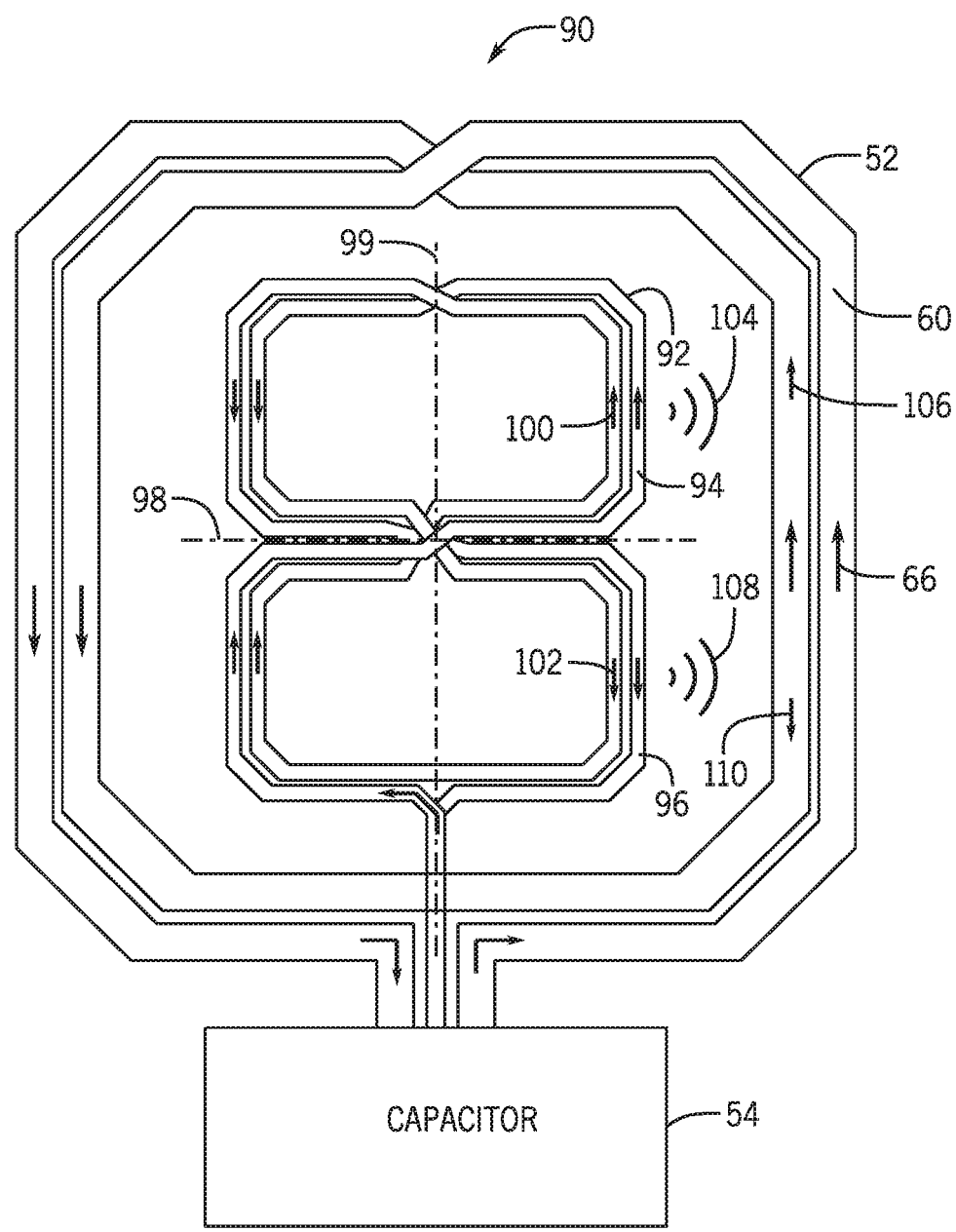
FIG. 9 is a schematic diagram showing radio frequency filtering circuitry having a first inductor and a second inductor having a symmetric layout disposed within a first inductor, according to embodiments of the present disclosure.

Thus, compensating for or reducing the transformer effect 82 caused by the current in the second inductor 56 may maintain or prevent a reduction of effectiveness of the filtering performance of the first inductor 52 and the capacitor 54. FIG. 9 is a schematic diagram of radio frequency filtering circuitry 90 having the first inductor 52 and a second inductor 92 having a symmetric or approximately symmetric layout disposed within the first inductor 52, according to embodiments of the present disclosure. In particular, the first inductor 52 includes a first coil 60, and the second inductor 92 includes a second coil 94 and a third coil 96 that is symmetrical or near symmetrical to the second coil 94. That is, the third coil 96 may be made of the same or similar components and/or materials as the second coil 94, and the structure of the third coil 96 may mirror the second coil 94 about one or more axes (e.g., 98, 99), such that the third coil 96 faces (e.g., has identical or near identical structure as) the second coil 94 around the one or more axes.

For example, the dimensions and/or shape of second coil 94 may be approximately symmetrical to that of the third coil 96, such that the material, length, width, height, diameter, thickness, number of windings, and/or radius of the coils 94, 96 may be approximately the same. Moreover, current in the second coil 94 may travel in an opposite direction from current in the third coil 96. As illustrated in FIG. 9, the second inductor 92 may be designed or structured so that current moves in a counterclockwise direction in the second coil 94 while moving in a clockwise direction in the third coil 96 when current is applied to the second inductor 92. For example, in some embodiments, the second coil 94 may be wound in a first direction (e.g., clockwise or counterclockwise), while the third coil 96 is wound in an opposite direction (e.g., counterclockwise or clockwise).

As such, applying current to the second inductor 92, and thus the second coil 94, may generate a first magnetic field 104, which may induce a first induced current 106 in the first coil 60 of the first inductor 52. That is, the current 100 in the second coil 94 may generate a first transformer effect with the first coil 60 of the first inductor 52. Similarly, applying the current to the second inductor 92, and thus the third coil 96, may also generate a second magnetic field 108, which may induce a second induced current 110 in the first coil 60 of the first inductor 52. That is, the current 102 in the third coil 96 may generate a second transformer effect with the first coil 60 of the first inductor 52.

Because the third coil 96 is symmetrical or near symmetrical to the second coil 94, the second magnetic field 108 may be equal in magnitude and opposite in direction to the first magnetic field 104. Accordingly, the second induced current 110 may be equal in magnitude and opposite in direction to the first induced current 106. Thus, the second induced current 110 in the first coil 60 induced by the current 102 in the third coil 96 may compensate for or cancel out the first induced current 106 in the first coil 60 induced by the current 100 in the second coil 94. As such, the symmetric layout of the second inductor 92 may maintain or prevent a reduction of effectiveness of the filtering performance of the first inductor 52 and the capacitor 54, and decrease or minimize differential imbalance in the first inductor 52 and/or the second inductor 92. Though the second inductor 92 is illustrated as being symmetrical about two axes 98, 99, it should be understood that, in some embodiments, the second inductor 92 may be symmetrical about only one axis (e.g., 98), as long as the current 106 induced in the first inductor 52 by a first set of coils (e.g., the second coil 94) of the second inductor 92 is compensated for by current 110 induced in the first inductor 52 by a second set of coils (e.g., the third coil 96) of the second inductor 92.

Moreover, by disposing the second inductor 92 within the first inductor 52 (e.g., instead of separate from the first inductor 52 and thus using space in the electronic device 10), valuable space in the electronic device 10 may be conserved. Additionally, because the inductors 52, 92 are not coupled over the capacitor 54 or other circuitry or electronic components, the common mode impedance of the first inductor 52 and/or the second inductor 92 may be well-defined (e.g., not affected by the capacitor 54 or other circuitry or electronic components being active).

It should be understood that the symmetric layout of the second inductor 92 illustrated in FIG. 9 is merely one example, and any suitable layout that compensates for transformer effects caused by the second inductor 92 are contemplated and may be substituted. For example, four, six, eight, nine, ten, twelve, twenty-five, and any other number of coils may be used in the second inductor 92, where current in a first set of the coils may induce current in the first inductor 52 by a magnitude in a first direction, and current in a second set of the coils may induce current in the first inductor 52 by the same magnitude in an opposite direction. Furthermore, while the second inductor 92 may include an HD2 inductor that suppresses oscillator flicker noise, in additional or alternative embodiments, the second inductor 92 may be any suitable filter that facilitates blocking certain frequencies or suppresses noise in an outgoing signal. For example, the second inductor 92 may include an LC-based notch filter that rejects an odd order harmonic of an outgoing signal.

Figure 10:
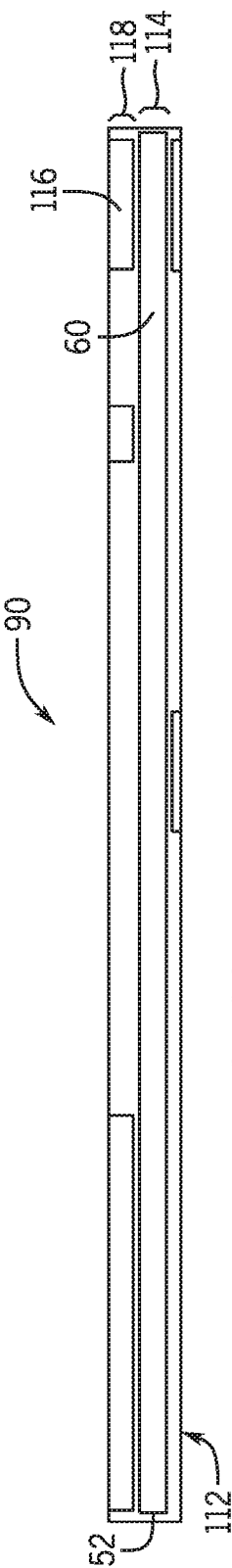
FIG. 10 is a schematic diagram showing a cross-section of the radio frequency filtering circuitry of FIG. 9, according to embodiments of the present disclosure.
Figure 11:
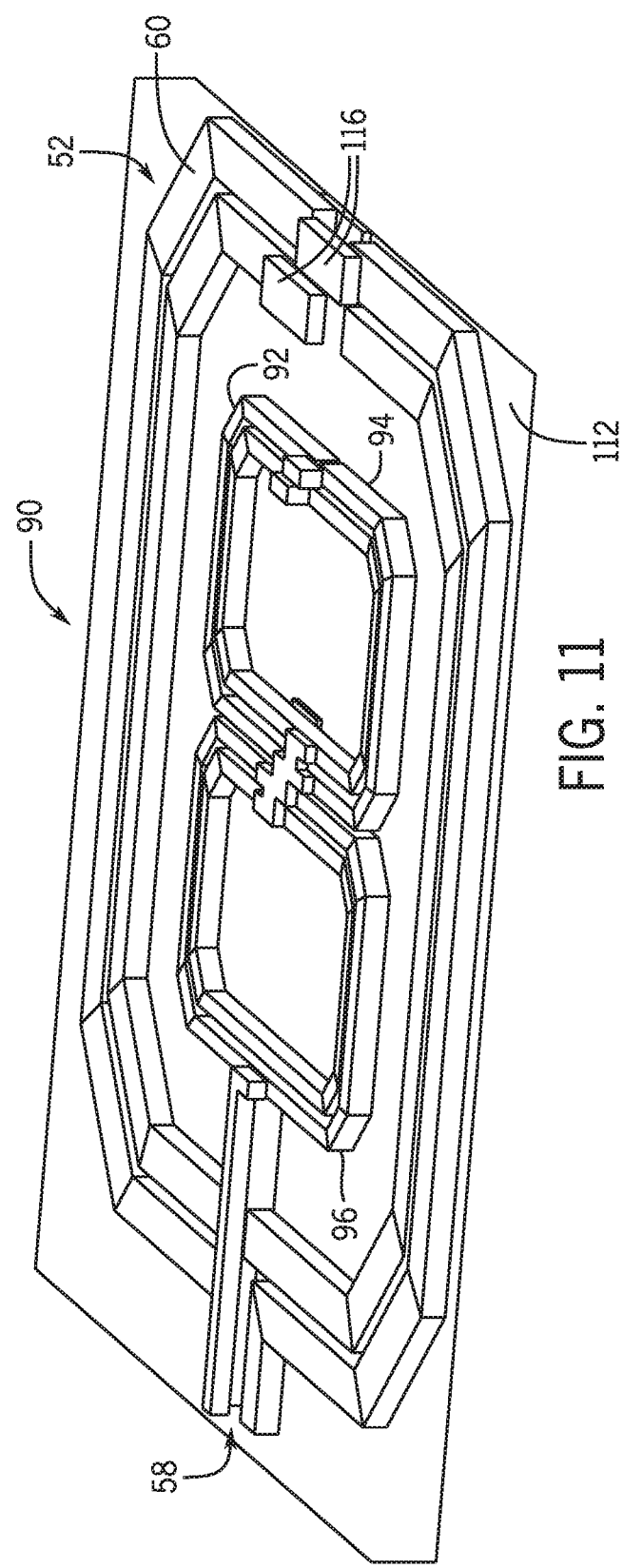
FIG. 11 is a schematic diagram showing a perspective view of the radio frequency filtering circuitry of FIG. 9, according to embodiments of the present disclosure.

For additional clarity, FIG. 10 is a schematic diagram showing a cross-section of the radio frequency filtering circuitry 90, and FIG. 11 is a schematic diagram showing a perspective view of the radio frequency filtering circuitry 90, according to embodiments of the present disclosure. As illustrated, the radio frequency filtering circuitry 90 may be mounted and/or etched on a printed circuit board (PCB) 112 of the electronic device 10. Moreover, various components of the radio frequency filtering circuitry 90 may be disposed on different layers of the PCB 112. For example, as shown in FIG. 10, the first inductor 52 is disposed on a first (e.g., lower) layer 114 of the PCB 112, while vias 116 that couple portions of the coil 60 of the first inductor 52 are disposed on a second (e.g., higher) layer 118 of the PCB 112. While the first inductor 52 is illustrated on the same layer 116 as the second inductor 92, in some embodiments, the first inductor 52 may be on a different layer (e.g., lower or higher) than the second inductor 92. For example, the first inductor 52 may be on the first layer 114, while the second inductor 92 may be on the second layer 118, or vice versa. Moreover, in additional or alternative embodiments, there may be one or more intermediate layers of PCB 112 between the layer that the first inductor 52 is disposed on (e.g., 114) and the layer that the second inductor 92 is disposed on (e.g., 118). In one embodiment, the coils 94, 96 of the second inductor 92 may be disposed on different layers of the PCB 112. Indeed, it should be understood that placement of the inductors 52, 92 and/or the coils 60, 94, 96 on different layers may not significantly affect the respective generated magnetic fields (e.g., 104, 108) and transformer effects when current is applied.

Due to the symmetric nature of the second coil 94 and the third coil 96 of the second inductor 92, the current 106 induced by the second coil 94 may add to the current 66 applied to the first inductor 52, while the current 110 induced by the third coil 96 may subtract from the current 66 applied to the first inductor 52, or vice versa. As such, any change to the inductance of the first inductor 52 caused by the current 106 induced by the second coil 94 may be compensated for by the current 110 induced by the third coil 96. Accordingly, the symmetric configuration of the second coil 94 and the third coil 96 of the second inductor 92 may also maintain the effectiveness (e.g., the inductance) of the first inductor 52.

Figure 12:
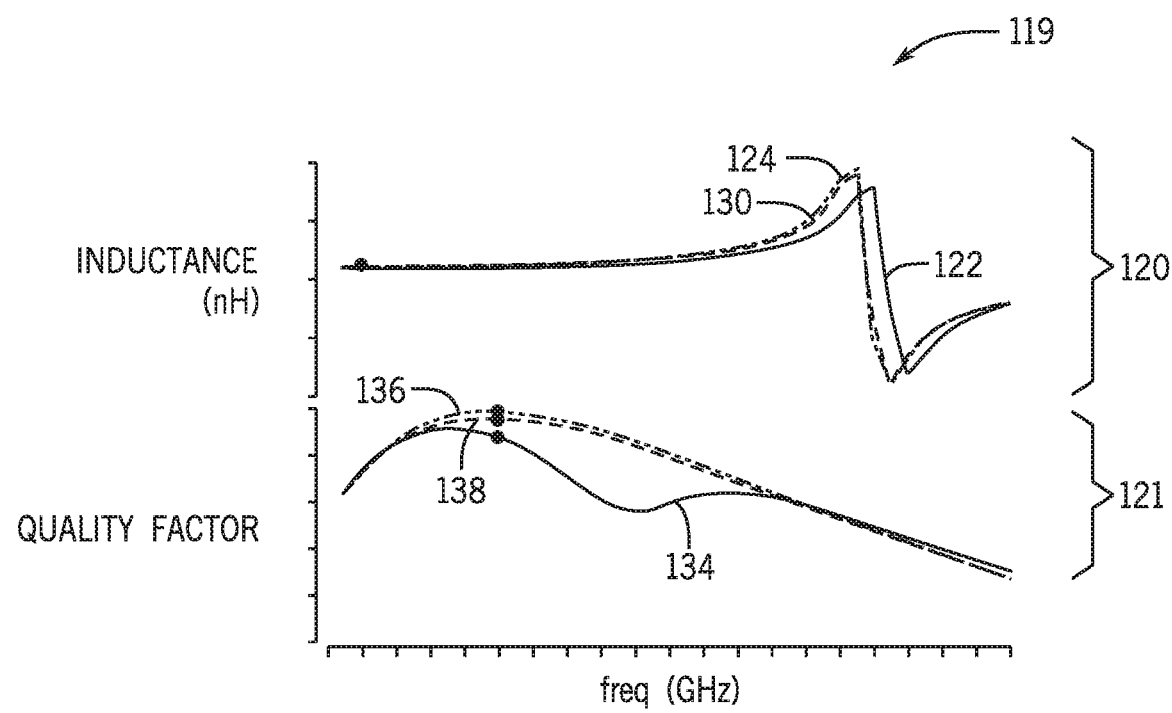
FIG. 12 is a plot comparing inductances and quality factors of the first inductor without a second inductor, the first inductor of the radio frequency filtering circuitry of FIG. 8, and the first inductor of the radio frequency filtering circuitry of FIG. 9, according to embodiments of the present disclosure.

Included for illustrative purposes, FIG. 12 is a plot 119 comparing the inductances and quality factors of the first inductor 52 without a second inductor, the first inductor 52 of the radio frequency filtering circuitry 80 of FIG. 8, and the first inductor 52 of the radio frequency filtering circuitry 90 of FIG. 9, over an operating range in frequency (in Gigahertz (GHz)) (e.g., a range that the radio frequency filtering circuitries may be used or typically be used). The case of the first inductor 52 without a second inductor is provided as an ideal example, as the absence of a second inductor prevents any negative interaction between the first inductor 52 and a second inductor. The top half 120 of the plot 119 illustrates inductance (in nano-Henries (nH)) in terms of frequency (in GHz). In particular, an inductance 122 of the first inductor 52 of the radio frequency filtering circuitry 80 of FIG. 8 (which has a non-symmetric second inductor 56), an inductance 124 of the first inductor 52 without a second inductor, and an inductance 130 of the first inductor 52 of the radio frequency filtering circuitry 90 of FIG. 9 are illustrated. As shown, the inductances 122, 124, 130 are similar in magnitude over the operating range of the plot 119. Indeed, the inductance 122 of the first inductor 52 of the radio frequency filtering circuitry 80 of FIG. 8 is slightly less than that of the inductance 124 of the first inductor 52 without a second inductor, and the inductance 130 of the first inductor 52 of the radio frequency filtering circuitry 90 of FIG. 9.

Moreover, the bottom half 121 of the plot 119 illustrates the quality factors (Q factors) of the first inductor 52 without a second inductor, the first inductor 52 of the radio frequency filtering circuitry 80 of FIG. 8, and the first inductor 52 of the radio frequency filtering circuitry 90 of FIG. 9. The Q factor of the first inductor 52 refers to the ratio of the inductive reactance of the first inductor 52 to the resistance of the first inductor 52 at a given frequency, and provides a measure of the efficiency of the first inductor 52. That is, the Q factor expresses the efficacy of an inductor. The higher the Q factor of the first inductor 52, the closer the first inductor 52 approaches the behavior of an ideal inductor, and thus the better-performing the first inductor 52. As illustrated, the Q factor 134 of the first inductor 52 of the radio frequency filtering circuitry 80 of FIG. 8 (which has a non-symmetric second inductor 56) is much less (e.g., at least 20% lower) than the Q factor 136 of the first inductor 52 without a second inductor. However, the Q factor 138 of the first inductor 52 of the radio frequency filtering circuitry 90 of FIG. 9 (which has a symmetric second inductor 92) is only slight less (e.g., at most 5% less) than the Q factor 136 of the first inductor 52 without a second inductor.

Accordingly, the plot 119 illustrates that the first inductor 52 of the radio frequency filtering circuitry 90 of FIG. 9 with the symmetric second inductor 92 exhibits close to the same performance and effectiveness (e.g., by exhibiting similar inductance and Q factor) as the ideal case of the first inductor 52 without a second inductor, and improved performance and effectiveness (e.g., higher inductance and Q factor) when compared to that of the radio frequency filtering circuitry 80 of FIG. 8 (which has a non-symmetric second inductor 56).

Figure 13:
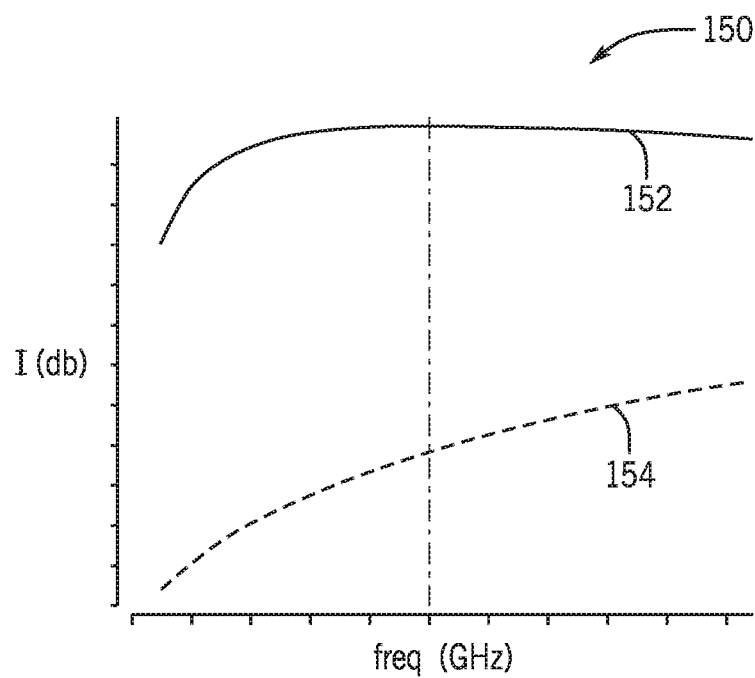
FIG. 13 is a plot comparing inductive coupling from the first inductor to the second inductor of the radio frequency filtering circuitry of FIG. 8 and the radio frequency filtering circuitry of FIG. 9, according to embodiments of the present disclosure.

Because the second induced current 110 in the first coil 60 induced by the current 102 in the third coil 96 of the radio frequency filtering circuitry 90 of FIG. 9 compensates for the first induced current 106 in the first coil 60 induced by the current 100 in the second coil 94, the second inductor 92 effectively reduces or minimizes inductive coupling with the first inductor 52, particularly when compared to the radio frequency filtering circuitry 80 of FIG. 8 (which has a non-symmetric second inductor 56). For illustrative purposes, FIG. 13 is a plot 150 comparing inductive coupling from the first inductor 52 to the non-symmetric second inductor 56 of the radio frequency filtering circuitry 80 of FIG. 8 and inductive coupling from the first inductor 52 to the symmetric second inductor 92 of the radio frequency filtering circuitry 90 of FIG. 9, according to embodiments of the present disclosure. The plot 150 represents inductive coupling as current gain (in decibels (dB)) in terms of frequency (in GHz). As illustrated, the inductive coupling 152 between the first inductor 52 and the non-symmetric second inductor 56 of the radio frequency filtering circuitry 80 of FIG. 8 (e.g., between −56 and −44 dB) is noticeably greater than the inductive coupling 154 between the first inductor 52 and the symmetric second inductor 92 of the radio frequency filtering circuitry 90 of FIG. 9 (e.g., between −91 and −70 dB).

Accordingly, the plot 150 illustrates that the symmetric second inductor 92 of the radio frequency filtering circuitry 90 of FIG. 9 reduces or minimizes inductive coupling with the first inductor 52, particularly when compared to the non-symmetric second inductor 56 of the radio frequency filtering circuitry 80 of FIG. 8.

Figure 14:
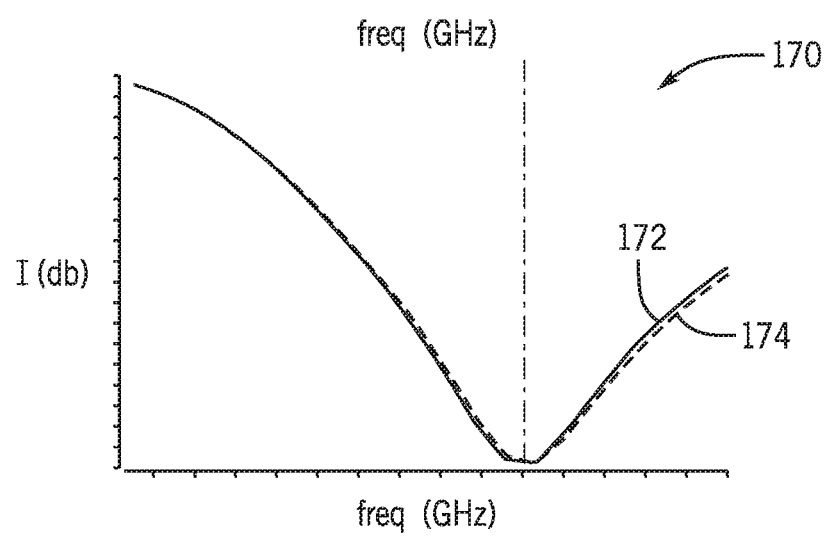
FIG. 14 is a plot comparing current rejection between the non-symmetric second inductor of the radio frequency filtering circuitry of FIG. 8 and the symmetric second inductor of the radio frequency filtering circuitry of FIG. 9, according to embodiments of the present disclosure.

Moreover, the symmetric second inductor 92 of the radio frequency filtering circuitry 90 of FIG. 9 may perform almost as well (e.g., almost identically) to a more conventional, non-symmetric inductor in terms of, for example, current rejection. For illustrative purposes, FIG. 14 is a plot 170 comparing current rejection between the non-symmetric second inductor 56 of the radio frequency filtering circuitry 80 of FIG. 8 and the symmetric second inductor 92 of the radio frequency filtering circuitry 90 of FIG. 9, according to embodiments of the present disclosure. The plot 170 represents current rejection as current gain (in decibels (dB)) in terms of frequency (in GHz). As illustrated, the current rejection 172 of the non-symmetric second inductor 56 of the radio frequency filtering circuitry 80 of FIG. 8 is approximately the same (e.g., within one dB at the point of greatest difference of current rejection) as the current rejection 174 of the symmetric second inductor 92 of the radio frequency filtering circuitry 90 of FIG. 9.

Accordingly, the plot 170 illustrates that the symmetric second inductor 92 of the radio frequency filtering circuitry 90 of FIG. 9 rejects approximately the same amount of current as the non-symmetric second inductor 56 of the radio frequency filtering circuitry 80 of FIG. 8.

Figure 15:
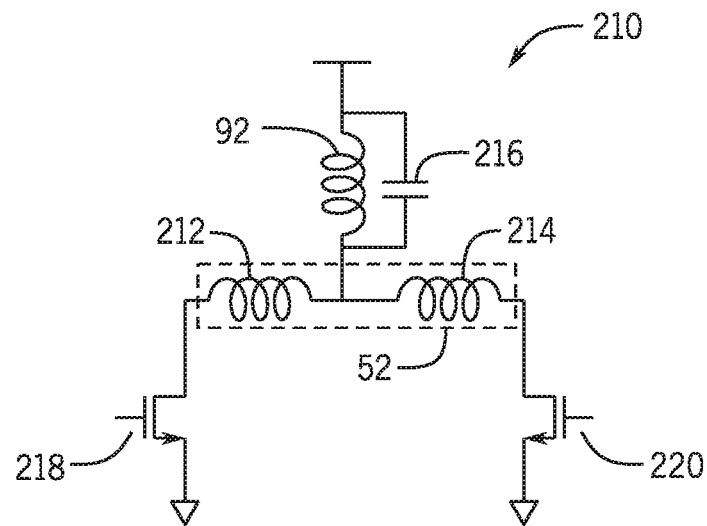
FIG. 15 is a circuit diagram of a second harmonic distortion resonance filter that may block certain frequencies and second harmonics in an input signal by presenting a high impedance, according to embodiments of the present disclosure.
Figure 16:
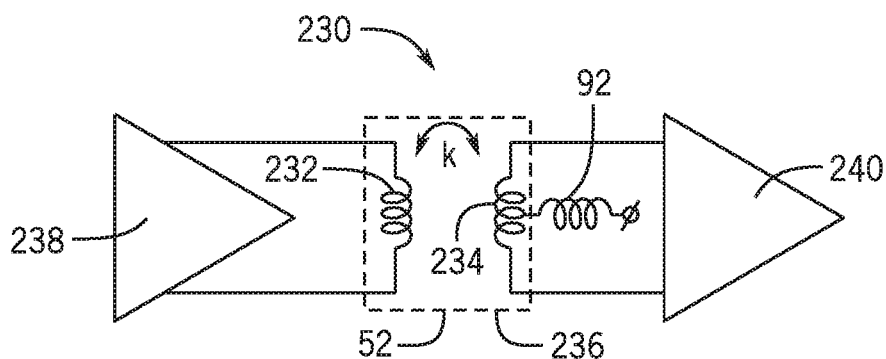
FIG. 16 is a circuit diagram of a bias choke that may block certain frequencies in an input signal while allowing a certain current to pass through, according to embodiments of the present disclosure.
Figure 17:
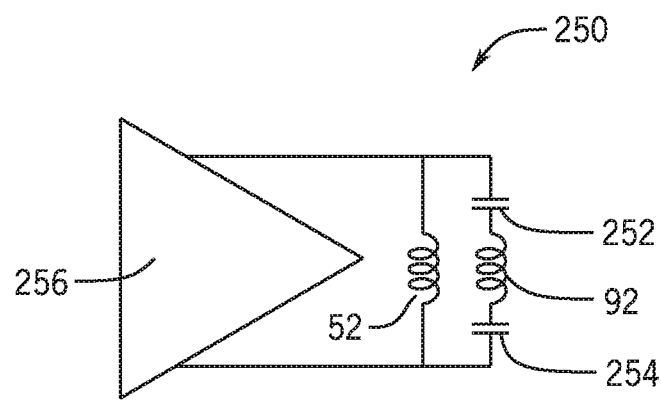
FIG. 17 is a circuit diagram of a third harmonic distortion notch filter that may block certain frequencies and third harmonics in an input signal by presenting a high impedance, according to embodiments of the present disclosure.

FIGS. 15-17 are circuit diagram of example circuit applications of the radio frequency filtering circuitry 90 of FIG. 9. In particular, FIG. 15 is a circuit diagram of a second harmonic distortion resonance filter 210 that may block certain (e.g., higher) frequencies and second harmonics in an input signal by presenting a high impedance, according to embodiments of the present disclosure. The first inductor 52 may include two coils 212 and 214, and the second inductor 92 (e.g., having the symmetric layout of the coils 94, 96) may be disposed within (e.g., embedded in) the first inductor 52 (e.g., disposed within the first coil 212, the second coil 214, or both). As illustrated, the second inductor 92 may be coupled in parallel with the two coils 212 and 214, and may also be coupled in parallel with capacitor 216. Each coil 212, 214 may be coupled to a respective transistor 218, 220.

FIG. 16 is a circuit diagram of a bias choke 230 that may block certain (e.g., higher) frequencies in an input signal while allowing a certain (e.g., direct) current to pass through, according to embodiments of the present disclosure. As illustrated, the first inductor 52 may include two coils 232, 234 that form a transformer 236, with one of the coils 234 coupled to the second inductor 92 (e.g., having the symmetric layout of the coils 94, 96). Each coil 232, 234 that forms the transformer 236 may be coupled to a respective power amplifier 238, 240.

FIG. 17 is a circuit diagram of a third harmonic distortion (HD3) notch filter 250 that may block certain (e.g., higher) frequencies and third harmonics in an input signal by presenting a high impedance, according to embodiments of the present disclosure. As illustrated, the first inductor 52 may be coupled in parallel with the second inductor 92 (e.g., having the symmetric layout of the coils 94, 96), which may be coupled to two capacitors 252, 254. The first and second inductors 52, 92 may also be coupled a power amplifier 256.

It should be understood that the circuit applications shown in FIGS. 15-17 are provided as examples, and the radio frequency filtering circuitry 90 of FIG. 9 may be applied to any circuitry that seeks to filter radio frequency signals and conserve space in an electronic device, without sacrificing radio frequency filtering performance. For example, the radio frequency filtering circuitry 90 of FIG. 9 may be applied to transformers, baluns, routings, and so on.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device having radio frequency filtering circuitry comprising:
    a first inductor comprising a first coil and a center tap; and
    a second inductor coupled to and disposed within the first coil, wherein the second inductor comprises a second coil and a third coil, wherein when applying current to the radio frequency filtering circuitry, the current in the second coil causes a first induced current in the first coil and the current in the third coil causes a second induced current in the first coil, wherein the second induced current is approximately equal in magnitude and opposite in direction to the first induced current, wherein the second inductor is coupled to the center tap of the first inductor, and wherein the radio frequency filtering circuitry is configured to block one or more frequencies in an input signal.

2. The electronic device of claim 1, wherein the second inductor is symmetric to the first inductor.

3. The electronic device of claim 1, wherein the first induced current adds to the current in the first coil, and wherein the second induced current subtracts from the current in the first coil.

4. The electronic device of claim 1, wherein the second induced current adds to the current in the first coil, and wherein the first induced current subtracts from the current in the first coil.

5. The electronic device of claim 1, wherein the current in the second coil generates a first magnetic field and the current in the third coil generates a second magnetic field, and wherein the second magnetic field is approximately equal in magnitude and opposite in direction to the first magnetic field.

6. The electronic device of claim 5, wherein the first magnetic field induces the first induced current in the first coil, and wherein the second magnetic field induces the second induced current in the first coil.

7. The electronic device of claim 1, wherein the second coil and the third coil are symmetric.

8. The electronic device of claim 1, wherein the electronic device comprises a printed circuit board having at least one layer, wherein the first inductor and the second inductor are disposed on the same layer as the at least one layer.

9. The electronic device of claim 1, wherein the electronic device comprises a printed circuit board having a plurality of layers, wherein the first inductor is disposed on a first layer of the plurality of layers, and wherein the second inductor is disposed on a second layer of the plurality of layers.

10. The electronic device of claim 1, wherein the electronic device comprises a printed circuit board having a plurality of layers, wherein the second coil is disposed on a first layer of the plurality of layers, and wherein the third coil is disposed on a second layer of the plurality of layers.

11. Radio frequency filtering circuitry comprising:
    a first inductor comprising a first coil and a center tap; and
    a second inductor coupled to the center tap of the first inductor and disposed within the first coil, wherein the second inductor comprises:
        a second coil configured to generate a first magnetic field; and
        a third coil configured to generate a second magnetic field that compensates for an effect of the first magnetic field on the first coil, wherein the radio frequency filtering circuitry is configured to block one or more frequencies in an input signal.

12. The radio frequency filtering circuitry of claim 11, wherein the second magnetic field is approximately the same in magnitude and opposite in direction as the first magnetic field.

13. The radio frequency filtering circuitry of claim 11, wherein the first magnetic field induces a first current in the first coil, wherein the second magnetic field induces a second current in the first coil, wherein the second current is approximately the same in magnitude and opposite in direction as the first current.

14. The radio frequency filtering circuitry of claim 11, wherein the first inductor comprises a fourth coil, wherein the radio frequency filtering circuitry comprises a capacitor, wherein the second inductor is coupled in parallel with the first coil, the fourth coil, and the capacitor, and wherein the radio frequency filtering circuitry is configured to block second harmonics in the input signal.

15. The radio frequency filtering circuitry of claim 11, wherein the first inductor comprises a fourth coil, wherein the first coil and the fourth coil are configured to form a transformer, wherein the first coil or the fourth coil is coupled to the second inductor, and wherein the radio frequency filtering circuitry is configured to block the one or more frequencies in the input signal while allowing a direct current to pass through.

16. The radio frequency filtering circuitry of claim 11, comprising one or more capacitors coupled to the second inductor in series, wherein the first inductor is coupled to the second inductor and the one or more capacitors in parallel, and wherein the radio frequency filtering circuitry is configured to block third harmonics in the input signal.

17. Inductor-capacitor choke circuitry comprising:
    a capacitor;
    a first inductor coupled to the capacitor, wherein the first inductor comprises a first coil and a center tap; and a second inductor coupled to the center tap of the first inductor and disposed within the first coil, wherein the second inductor comprises a second coil and a third coil, wherein current in the second coil generates a first transformer effect with the first coil, wherein the current in the third coil generates a second transformer effect with the first coil, wherein the second transformer effect compensates for the first transformer effect, and wherein the inductor-capacitor choke circuitry is configured to block one or more frequencies in an input signal.

18. The inductor-capacitor choke circuitry of claim 17, wherein the inductor-capacitor choke circuitry is configured to block second harmonics in the input signal.

19. The inductor-capacitor choke circuitry of claim 17, wherein the first transformer effect induces a first induced current in the first coil, wherein the second transformer effect induces a second induced current in the first coil having the same magnitude and opposite direction as the first induced current.

20. The inductor-capacitor choke circuitry of claim 19, wherein:
the first induced current is in the same direction as the current in the first coil, and the second induced current is in the opposite direction as the current in the first coil; or
the first induced current is in the opposite direction as the current in the first coil, and the second induced current is in the same direction as the current in the first coil.

\* \* \* \* \*